(12) United States Patent
Chen et al.

(10) Patent No.: US 10,158,043 B2
(45) Date of Patent: Dec. 18, 2018

(54) LIGHT-EMITTING DIODE AND METHOD FOR MANUFACTURING THE SAME

(71) Applicant: MIKRO MESA TECHNOLOGY CO., LTD., Apia (WS)

(72) Inventors: Li-Yi Chen, Tainan (TW); Pei-Yu Chang, Tainan (TW); Hsin-Wei Lee, Tainan (TW); Chun-Yi Chang, Tainan (TW); Shih-Chyn Lin, Tainan (TW)

(73) Assignee: MIKRO MESA TECHNOLGY CO., LTD., Apia (WS)

( * ) Notice: Subject to any disclaimer, the term of this patent is extended or adjusted under 35 U.S.C. 154(b) by 0 days.

(21) Appl. No.: 15/450,048

(22) Filed: Mar. 6, 2017

(65) Prior Publication Data

US 2017/0179340 A1  Jun. 22, 2017

Related U.S. Application Data

(63) Continuation-in-part of application No. 14/940,123, filed on Nov. 12, 2015, now Pat. No. 9,590,137,
(Continued)

(51) Int. Cl.
*H01L 21/00* (2006.01)
*H01L 33/14* (2010.01)
(Continued)

(52) U.S. Cl.
CPC .............. *H01L 33/14* (2013.01); *H01L 24/83* (2013.01); *H01L 33/0054* (2013.01); *H01L 33/0079* (2013.01); *H01L 33/145* (2013.01); *H01L 33/343* (2013.01); *H01L 33/38* (2013.01); *H01L 33/44* (2013.01); *H01L 25/0753* (2013.01); *H01L 2224/83191* (2013.01);
(Continued)

(58) Field of Classification Search
CPC ....... H01L 33/14; H01L 24/83; H01L 33/343; H01L 2224/83191
See application file for complete search history.

(56) References Cited

U.S. PATENT DOCUMENTS 4,535,530 A * 8/1985 Denda ............... H01L 27/10844
257/297
5,719,449 A   2/1998 Strauss
(Continued)

FOREIGN PATENT DOCUMENTS

CN         1346154 A    4/2002
CN       102074635 A    5/2011
(Continued)

*Primary Examiner* — Laura Menz
(74) *Attorney, Agent, or Firm* — CKC & Partners Co., Ltd.

(57) ABSTRACT

A method for manufacturing a light-emitting diode (LED) includes plural steps as follows. A first type semiconductor layer is formed. A second type semiconductor layer is formed on the first type semiconductor layer. An impurity is implanted into a first portion of the second type semiconductor layer. The concentration of the impurity present in the first portion of the second type semiconductor layer is greater than the concentration of the impurity present in a second portion of the second type semiconductor layer after the implanting, such that the resistivity of the first portion of the second type semiconductor layer is greater than the resistivity of the second portion of the second type semiconductor layer.

13 Claims, 11 Drawing Sheets

Related U.S. Application Data which is a continuation-in-part of application No. 14/718,106, filed on May 21, 2015, now Pat. No. 9,219,197, and a continuation-in-part of application No. 14/701,514, filed on Apr. 30, 2015, now Pat. No. 9,231,153, said application No. 14/718,106 is a continuation-in-part of application No. 14/290,999, filed on May 30, 2014, now Pat. No. 9,105,813, said application No. 14/701,514 is a continuation-in-part of application No. 14/290,999, filed on May 30, 2014, now Pat. No. 9,105,813.

(51) Int. Cl.
*H01L 33/34* (2010.01)
*H01L 33/00* (2010.01)
*H01L 23/00* (2006.01)
*H01L 33/38* (2010.01)
*H01L 33/44* (2010.01)
H01L 25/075 (2006.01)

(52) U.S. Cl.
CPC ............... *H01L 2924/0002* (2013.01); *H01L 2933/0016* (2013.01); *H01L 2933/0025* (2013.01)

(56) References Cited

U.S. PATENT DOCUMENTS

| | | | |
|---|---|---|---|
| 6,153,973 A | 11/2000 | Shibata et al. | |
| 6,540,576 B1 | 4/2003 | Watanabe et al. | |
| 8,525,210 B2 * | 9/2013 | Tanaka | H01L 33/42 257/98 |
| 9,105,813 B1 * | 8/2015 | Chang | H01L 33/44 |
| 9,184,342 B1 * | 11/2015 | Chang | H01L 33/44 |
| 9,219,197 B1 * | 12/2015 | Chen | H01L 33/38 |
| 9,231,153 B2 * | 1/2016 | Chen | H01L 33/145 |
| 9,385,267 B2 * | 7/2016 | Chen | H01L 33/44 |
| 9,433,050 B2 * | 8/2016 | Chang | H05B 33/0845 |
| 9,590,137 B2 * | 3/2017 | Chen | H01L 33/145 |
| 2006/0125716 A1 | 6/2006 | Wong et al. | |
| 2007/0145892 A1 | 6/2007 | Chen | |
| 2007/0181894 A1 | 8/2007 | Stein et al. | |
| 2007/0292979 A1 * | 12/2007 | Hata | B82Y 20/00 438/22 |
| 2008/0185606 A1 * | 8/2008 | Sano | H01L 33/42 257/98 |
| 2009/0283795 A1 | 11/2009 | Miki et al. | |
| 2010/0073764 A1 | 3/2010 | Kai et al. | |
| 2012/0205705 A1 * | 8/2012 | Tanaka | H01L 33/42 257/98 |
| 2013/0112945 A1 * | 5/2013 | Gilet | H01L 33/06 257/13 |
| 2013/0140521 A1 * | 6/2013 | Gilet | H01L 33/04 257/13 |
| 2014/0077156 A1 * | 3/2014 | Bavencove | H01L 27/153 257/13 |
| 2015/0349200 A1 * | 12/2015 | Chen | H01L 33/145 257/98 |
| 2015/0349205 A1 * | 12/2015 | Chen | H01L 33/38 257/99 |
| 2016/0056330 A1 * | 2/2016 | Scaringella | B82Y 20/00 257/13 |
| 2016/0064594 A1 * | 3/2016 | Chen | H01L 33/44 257/94 |
| 2016/0072012 A1 * | 3/2016 | Chen | H01L 33/145 257/101 |
| 2016/0104818 A1 * | 4/2016 | Chang | H05B 33/0845 315/291 |
| 2016/0284938 A1 * | 9/2016 | Hyot | H01L 33/18 |
| 2016/0322536 A1 * | 11/2016 | Dornel | H01L 33/0075 |
| 2017/0036342 A1 * | 2/2017 | Chen | B25J 15/008 |
| 2017/0062683 A1 * | 3/2017 | Chen | H01L 33/405 |
| 2017/0179340 A1 * | 6/2017 | Chen | H01L 33/14 |
| 2018/0090437 A1 * | 3/2018 | Harada | H01L 24/00 |

FOREIGN PATENT DOCUMENTS

| | | | |
|---|---|---|---|
| JP | H08340132 A | 12/1996 | |
| WO | WO 2014184487 A1 * | 11/2014 | ..... H01L 31/035227 |

* cited by examiner

LIGHT-EMITTING DIODE AND METHOD FOR MANUFACTURING THE SAME

RELATED APPLICATIONS

The present application is a continuation-in-part application of U.S. application Ser. No. 14/940,123, filed on Nov. 12, 2015. The U.S. application Ser. No. 14/940,123 is a continuation-in-part application of U.S. application Ser. No. 14/701,514, filed on Apr. 30, 2015, issued on Jan. 5, 2016 with U.S. Pat. No. 9,231,153, and U.S. application Ser. No. 14/718,106, filed on May 21, 2015, issued on Dec. 22, 2015 with U.S. Pat. No. 9,219,197. The U.S. application Ser. No. 14/701,514 is a continuation-in-part application of U.S. application Ser. No. 14/290,999, filed May 30, 2014. The U.S. application Ser. No. 14/718,106 is a continuation-in-part application of the U.S. application Ser. No. 14/290,999, filed May 30, 2014. The entire disclosures of the above applications are hereby incorporated by reference herein.

BACKGROUND

Description of Related Art

In the recent years light-emitting diodes (LEDs) have become popular in general and commercial lighting applications. As light sources, LEDs have many advantages including the aspects of low energy consumption, long lifetime, small size, and faster switching, and hence conventional illuminant technology, such as incandescent lamps, is gradually replaced by LEDs. In an LED, when electrons and holes recombine across the band gap in the active layer, the recombination energy is emitted in the form of photons. This recombination mechanism is the so-called radiative recombination.

In an LED display uses an array contains large quantity of micro-size LEDs. In order to provide an adequate brightness (e.g., about 500 nits-3000 nits), the emitting energy of each of the LEDs usually must be well controlled. Otherwise, the efficiency of the LED display will be low. To control the emitting energy and maintaining the efficiency and uniformity of the display are important.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1A:
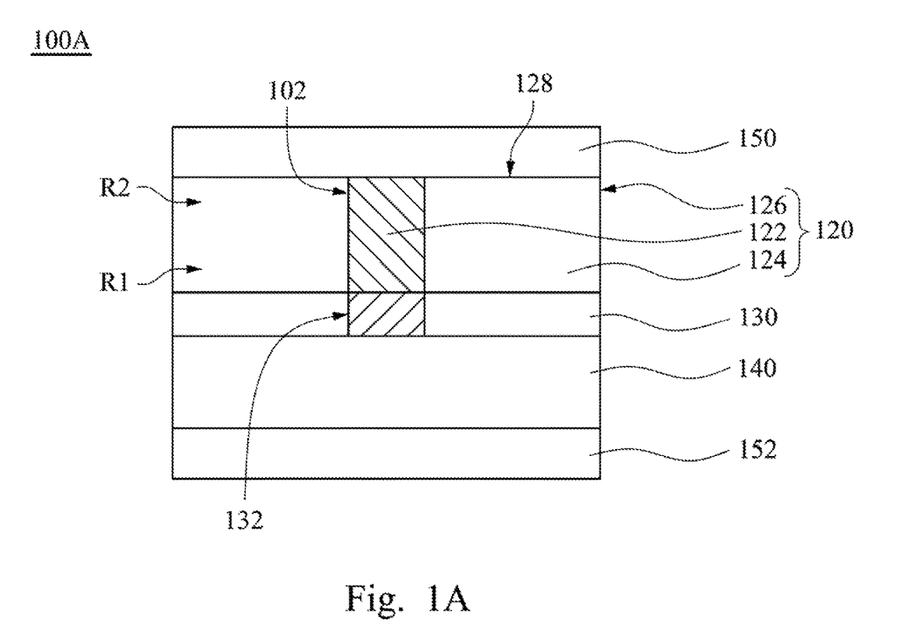
FIG. 1A is a cross-sectional view of a light-emitting diode (LED) according to a first embodiment of the present disclosure.

FIG. 1A is a cross-sectional view of a light-emitting diode (LED) 100A according to a first embodiment of the present disclosure. The LED 100A includes a first type semiconductor layer 120, an active layer 130, a second type semiconductor layer 140, a first electrode layer 150, and a second electrode layer 152. The first type semiconductor layer 120 is disposed over the second type semiconductor layer 140, and the active layer 130 is disposed between the first type semiconductor layer 120 and the second type semiconductor layer 140.

The first type semiconductor layer 120 includes a low resistance portion 122 and a high resistance portion 124. In some embodiments, the low resistance portion 122 is separated from an edge 126 of the first type semiconductor layer 120 by the high resistance portion 124, and resistivity of the first type semiconductor layer 120 horizontally increases from the low resistance portion 122 toward the high resistance portion 124. The first electrode layer 150 is electrically coupled with the first type semiconductor layer 120, and surfaces of the low resistance portion 122 and the high resistance portion 124 facing away from the active layer 130 are covered with the first electrode layer 150. The second electrode layer 152 is electrically coupled with the second type semiconductor layer 140.

Since the resistivity of the first type semiconductor layer 120 horizontally increases from the low resistance portion 122 toward the high resistance portion 124, when the LED 100A is biased, charge carriers are apt to flow through the first type semiconductor layer 120 via the low resistance portion 122. Accordingly, at least one charge-carrier path 102 (i.e. a hatching area in the first type semiconductor layer 120) formed between the first electrode layer 150 and the active layer 130 at least partially overlaps with the low resistance portion 122, in which the charge-carrier path 102 defines a light-emitting zone 132 (i.e., a hatching area in the active layer 130) in the active layer 130. Therefore, a combination of the low resistance portion 122 and the high resistance portion 124 can confine an area where the current goes into the active layer 130, and hence the current density within the light-emitting zone 132 of the active layer 130 increases, thereby gaining the operating stability and efficiency of the LED 100A.

In addition the boundary of the charge-carrier path 102 can vary in accordance with the magnitude of the bias voltage or the current, and thus the boundary of the charge-carrier path 102 may be controllable and variable.

Figure 1B:
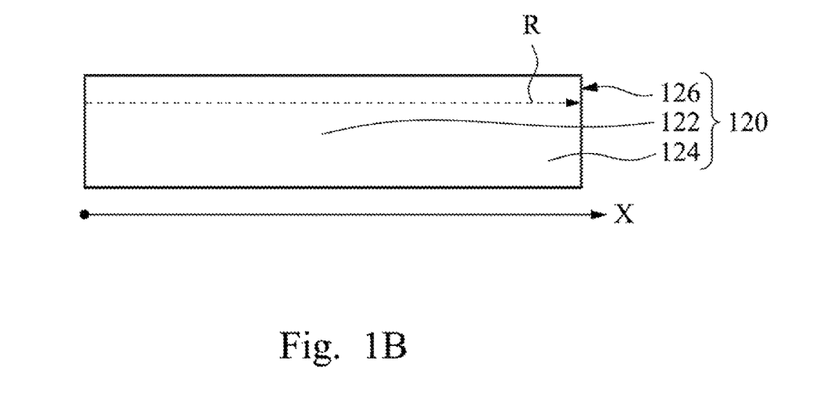
FIG. 1B is a cross-sectional view of the first type semiconductor layer of FIG. 1A with an x-axis X.
Figure 1C:
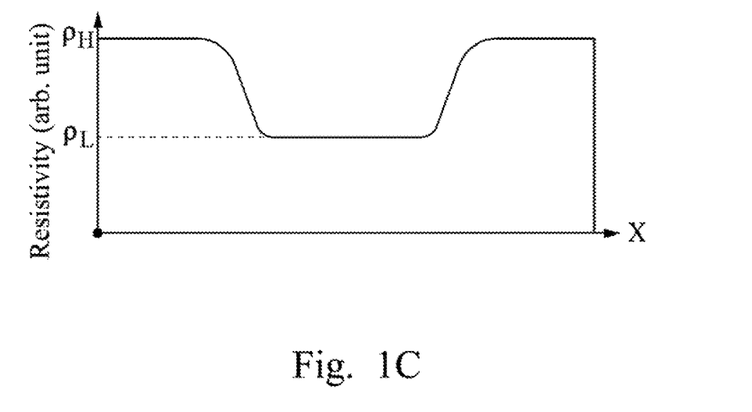
FIGS. 1C and 1D are graphs plotting relatively resistivity versus x-coordinate in the first type semiconductor layer of FIG. 1B.
Figure 1D:
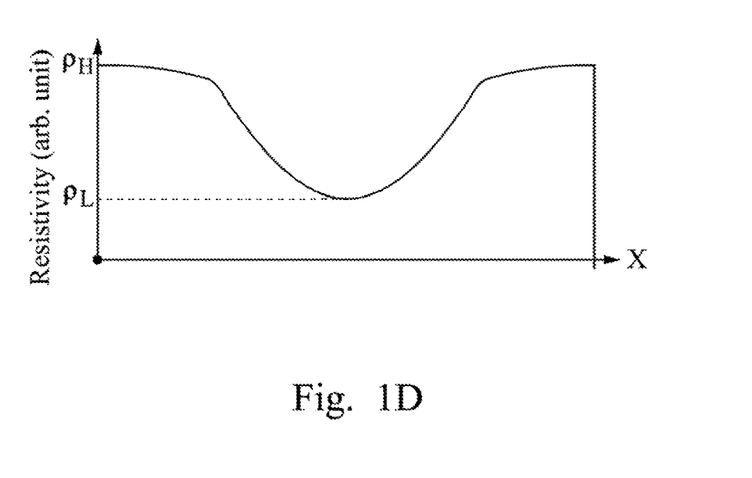

FIG. 1B is a cross-sectional view of the first type semiconductor layer 120 of FIG. 1A with an x-axis X. FIGS. 1C and 1D are graphs plotting relatively resistivity versus x-coordinate in the first type semiconductor layer 120 of FIG. 1B. In the graphs of FIGS. 1C and 1D each horizontal axis represents the x-axis X of FIG. 1B, each vertical axis represents the resistivity, and both of the x-axis and the resistivity are in arbitrary unit herein. Each curve plotted in FIGS. 1C and 1D represents the resistivity of the first type semiconductor layer 120 along the dot line R of FIG. 1B.

As shown in each curve of FIGS. 1C and 1D, a local minimum value of resistivity labeled as $\rho_L$ is present within the low resistance portion 122, and a local maximum value of resistivity labeled as $\rho_H$ is present within the high resistance portion 124. That is, as the resistivity of the first type semiconductor layer 120 gradually and horizontally increases from the low resistance portion 122 toward the high resistance portion 124, a local minimum value of the resistivity of the first type semiconductor layer 120 can be present within the low resistance portion 122. Furthermore, the curve of FIG. 1C shows that the resistivity sharply increases from the resistivity $\rho_L$ toward the resistivity $\rho_H$, and the curve of FIG. 1D shows that the resistivity gradually increases from the resistivity $\rho_L$ toward the resistivity $\rho_H$.

In some embodiments, the resistivity difference between the low resistance portion 122 and the high resistance portion 124 can be result from impurity concentration therein. For example, an impurity may be implanted into the high resistance portion 124 to make the concentration of the impurity present in the high resistance portion 124 be greater than the concentration of the impurity present in the low resistance portion 122. In some embodiments, the impurity includes silicon, oxygen, germanium, titanium, or combinations thereof. In some embodiments, the silicon may be implanted into the high resistance portion 124 to make the concentration of the silicon present in the high resistance portion 124 be greater than the concentration of the silicon present in the low resistance portion 122, such that the resistivity of the high resistance portion 124 is greater than the resistivity of the low resistance portion 122.

Reference is made back to FIG. 1A. By the increase of the resistivity from the low resistance portion 122 toward the high resistance portion 124, the charge-carrier path 102 can be separated from the edge 126 by the high resistance portion 124. In some embodiments, the high resistance portion 124 has a top surface 128 facing away from the active layer 130, and the resistivity of the high resistance portion 124 decreases from the top surface 128 toward the active layer 130. For example, in the first type semiconductor layer 120, the resistivity corresponding to the high resistance portion 124 near the top surface 128 is $\rho 1$, the resistivity corresponding to the high resistance portion 124 near the active layer 130 is $\rho 2$, and $\rho 1 \geq \rho 2$. In this regard, the first type semiconductor layer 120 may have a first region R1 and a second region R2, in which the first region R1 and the second region R2 at least partially overlap with the high resistance portion, and the second region R2 is separated from the active layer 130 by the first region R1. In some embodiments, the concentration of the impurity (e.g., silicon, oxygen, germanium, titanium, or combinations thereof) present in the first region R1 is less than that of the impurity present in the second region R2. In addition, the resistivity of the low resistance portion 122 is less than each of the resistivity $\rho 1$ and resistivity $\rho 2$.

Figure 2A:
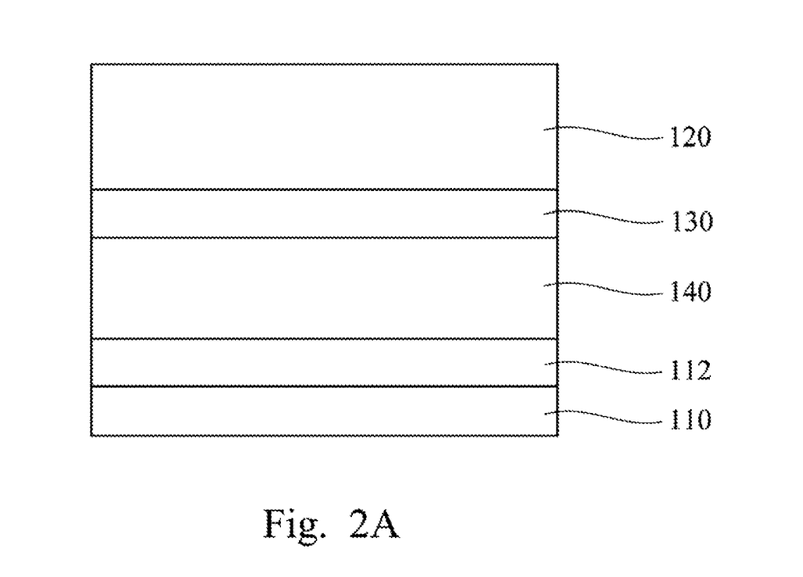
FIGS. 2A-2C are cross-sectional views of an LED at an intermediate stage of a method for manufacturing the same according to some embodiments of the present disclosure.
Figure 2B:
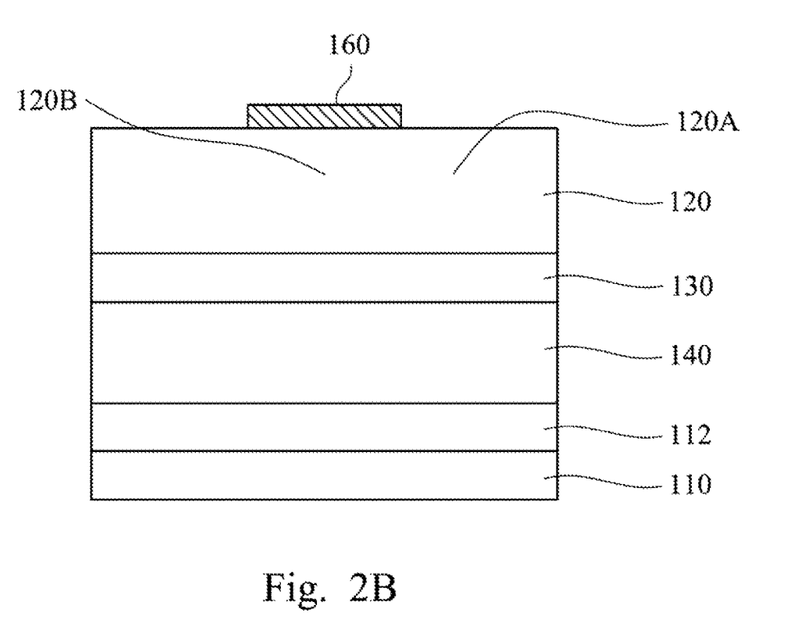
Figure 2C:
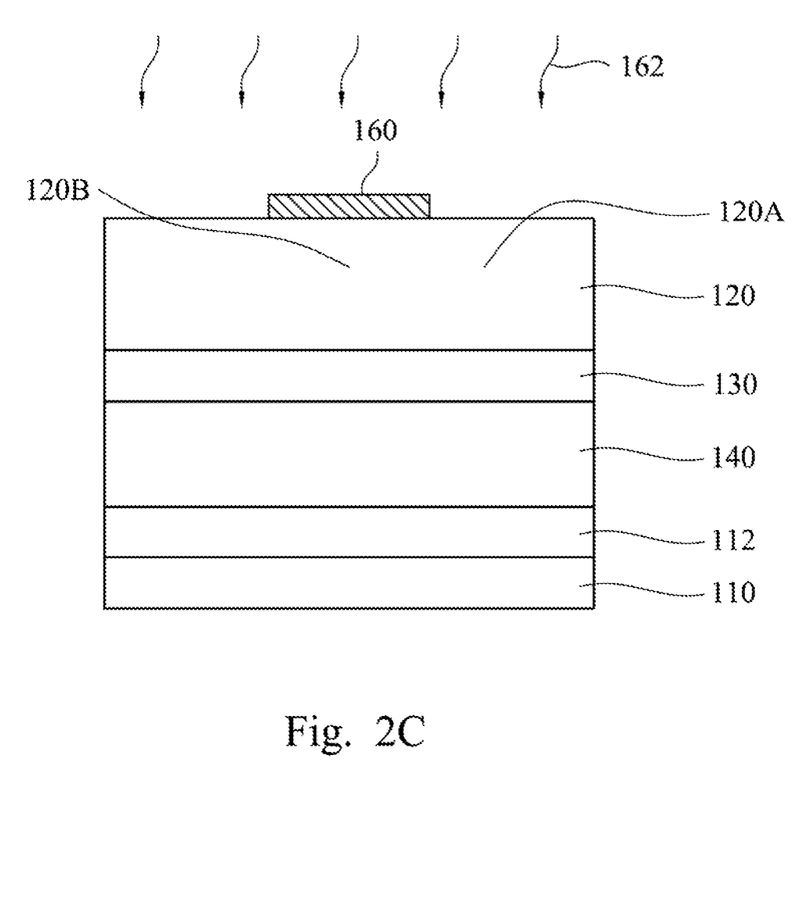

FIGS. 2A-2C are cross-sectional views of an LED at an intermediate stage of a method for manufacturing the same according to some embodiments of the present disclosure. The LED 100A of FIG. 1A can be manufactured by the following steps.

As shown in FIG. 2A, a buffer layer 112 is formed on a growth substrate 110. In some embodiments, several growth techniques may be used for growth of the buffer layer 112. In some embodiments, the growth substrate 110 may be a bulk substrate including sapphire ($Al_2O_3$) and GaAs. In alternative embodiments, the growth substrate 110 may be formed of other suitable materials such as, Si, GaN, SiC, ZnO or GaAs. In some embodiments, the buffer layer 112 may be made of a material different from or the same as the growth substrate 110. In alternative embodiments the buffer layer 112 may be a III-IV compound semiconductor layer such as GaN, InN, AlN, InGaN, AlGaN, InAlGaN, and combinations thereof.

Next, a second type semiconductor layer 140 is formed on the buffer layer 112, an active layer 130 is formed on the second type semiconductor layer 140, and a first type semiconductor layer 120 is formed on the active layer 130 and the second type semiconductor layer 140. In some embodiments, the first type semiconductor layer 120, the active layer 130 and the second type semiconductor layer 140 may be formed by, for example, epitaxy, such as metal-organic chemical vapor deposition (MOCVD). In some embodiments, the first type semiconductor layer 120 is a P-type semiconductor layer, the active layer 130 is a quantum well layer, and the second type semiconductor layer 140 is an N-type semiconductor layer.

As shown in FIG. 2B, a first protection layer 160 is formed on the first type semiconductor layer 120 to cover a portion of the first type semiconductor layer 120. In some embodiments, after the formation of the first protection layer 160, the first type semiconductor layer 120 can be divided into an exposed portion 120A and a covered portion 120B. In some embodiments, the first protection layer 160 serves as a diffusion barrier.

As shown in FIG. 2C, a post diffusion process is performed, in which the performed post diffusion process illustrated in FIG. 2C is a gas-diffusion process. During the post diffusion process, an impurity can be implanted into the first type semiconductor layer 120 by post diffusion, in which the impurity may include silicon, oxygen, germanium, titanium, or combinations thereof.

For example, a gaseous agent 162 can be applied to the first type semiconductor layer 120 to perform the post diffusion, in which the gaseous agent 162 includes the impurity element (e.g., silicon, oxygen, germanium, titanium or combinations thereof). Accordingly, the impurity can be diffused into the exposed portion 120A of the first type semiconductor layer 120, such that the concentration of the impurity present in the exposed portion 120A is greater than the concentration of the impurity present in the covered portion 120B.

After the post diffusion process, the resistivity of the exposed portion 120A of the first type semiconductor layer 120 is greater than the resistivity of the covered portion 120B of the first type semiconductor layer 120. Therefore, the exposed portion 120A of FIG. 2C corresponds to the high resistance portion 124 of FIG. 1A, and the covered portion 120B of FIG. 2C corresponds to the low resistance portion 122 of FIG. 1. Furthermore, in some embodiments, the post diffusion process can be performed under high temperature in a period, and thus the temperature and the period can be referred to as parameters in the post diffusion process.

In some embodiments, the gradient of the resistivity of the first type semiconductor layer 120 in the longitudinal direction can vary through tuning the parameters, such as prolonging the period of the post diffusion process. After the post diffusion process, the first protection layer 160 can be removed, and the first electrode layer 150 (see FIG. 1A) is formed on the first type semiconductor layer 120. Next, the structure illustrated in FIG. 2C can be transferred to a temporarily substrate and then chipped in sequence. In alternative embodiments, the structure illustrated in FIG. 2C can be chipped and then transferred to a temporarily substrate in sequence. After the transferring and the chipping steps, the structure can be transferred to a receiving substrate to form the second electrode layer 152 (see FIG. 1A), and then the LED 100A of FIG. 1A is obtained.

Figure 3A:
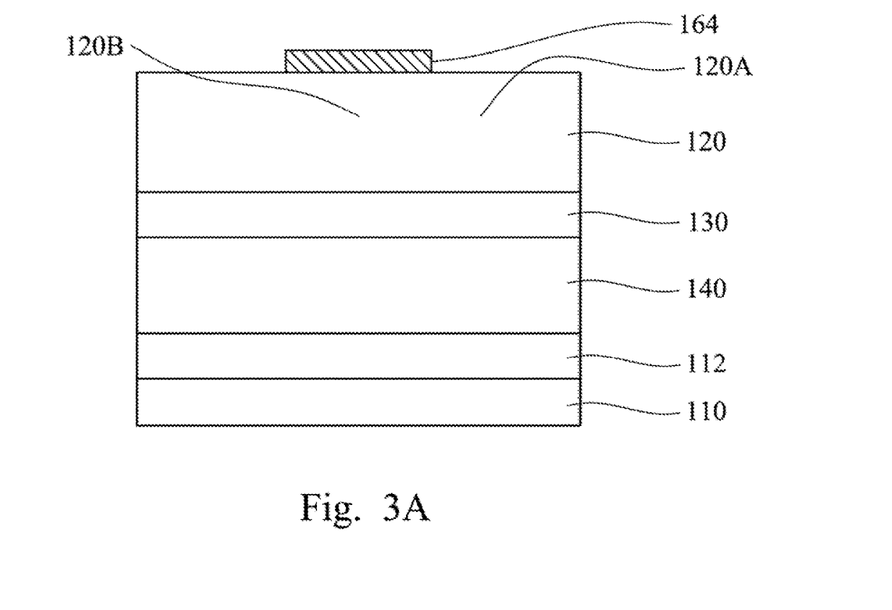
FIGS. 3A-3B are cross-sectional views of an LED at an intermediate stage of a method for manufacturing the same according to some embodiments of the present disclosure.
Figure 3B:
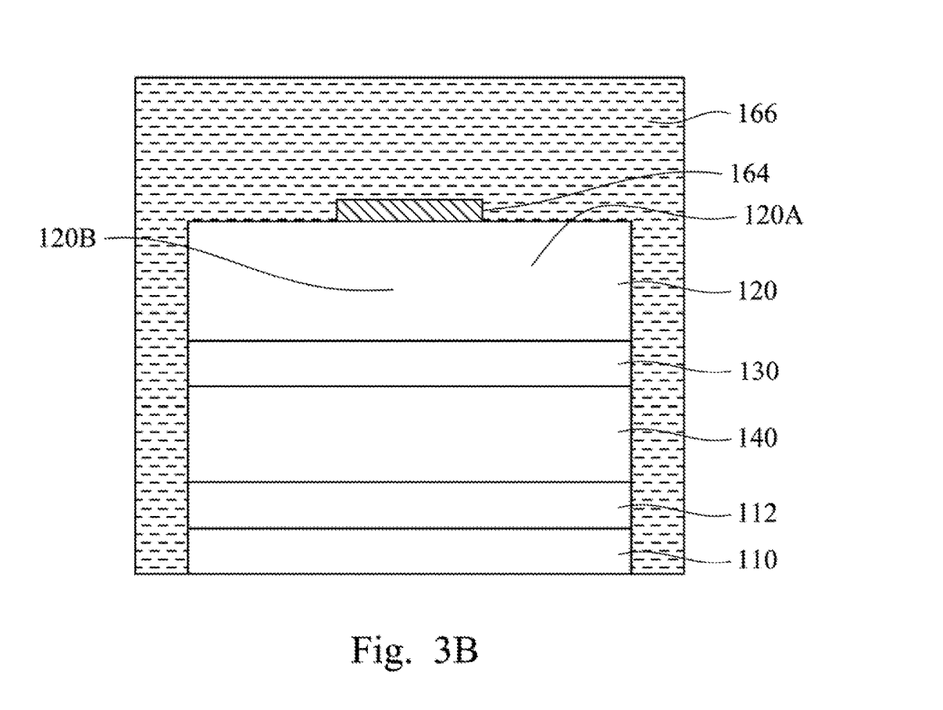

The LED including the first type semiconductor layer with the low and high resistance portions can be manufactured by another method as well. For example, the LED can be manufactured by a method illustrated in FIGS. 3A-3B, in which FIGS. 3A-3B are cross-sectional views of an LED at an intermediate stage of a method for manufacturing the same according to some embodiments of the present disclosure. The difference between the operations illustrated in FIGS. 3A-3B and the operations illustrated in FIGS. 2A-2C is that the performed post diffusion process illustrated in FIG. 3B is a fluid-diffusion process. In addition, in the operations illustrated in FIGS. 3A-3B, details which are similar to the operations illustrated in FIG. 2A are not repeated to avoid duplicity.

As shown in FIG. 3A, a second protection layer 164 is formed on a combination of a growth substrate 110, a buffer layer 112, a first type semiconductor layer 120, an active layer 130, and a second type semiconductor layer 140, in which the second protection layer 164 is disposed on and joined with the first type semiconductor layer 120 to cover a portion of the first type semiconductor layer 120. In some embodiments, after the formation of the second protection layer 164 the first type semiconductor layer 120 can be divided into an exposed portion 120A and a covered portion 120B. In embodiments, the second protection layer 164 serves as a diffusion barrier.

As shown in FIG. 3B, a post diffusion process is performed, in which the performed post diffusion process illustrated in FIG. 3B is a fluid-diffusion process. In some embodiments, a fluid agent 166 is applied to the first type semiconductor layer 120 to perform the post diffusing, in which the fluid agent 166 includes silicon, oxygen, germanium, titanium, or combinations thereof. For example, the combination of the first type semiconductor layer 120 the active layer 130, and the second type semiconductor layer 140 can be dipped into the fluid agent 166 to perform the post diffusing. Accordingly, the impurity can be diffused into the exposed portion 120A of the first type semiconductor layer 120, such that the concentration of the impurity present in the exposed portion 120A is greater than that present in the covered portion 120B.

After the post diffusion process, the resistivity of the exposed portion 120A of the first type semiconductor layer 120 is greater than the resistivity of the covered portion 120B of the first type semiconductor layer 120. Therefore, the exposed portion 120A of FIG. 3B corresponds to the high resistance portion 124 of FIG. 1A, and the covered portion 120B of FIG. 3B corresponds to the low resistance portion 122 of FIG. 1A. In some embodiments, the temperature and the period can be referred to as the parameters in the post diffusion process illustrated in FIG. 3B. Furthermore, after the post diffusion process, the second protection layer 164 can be removed, and the first electrode layer 150 (see FIG. 1A) is formed on the first type semiconductor layer 120.

Figure 3C:
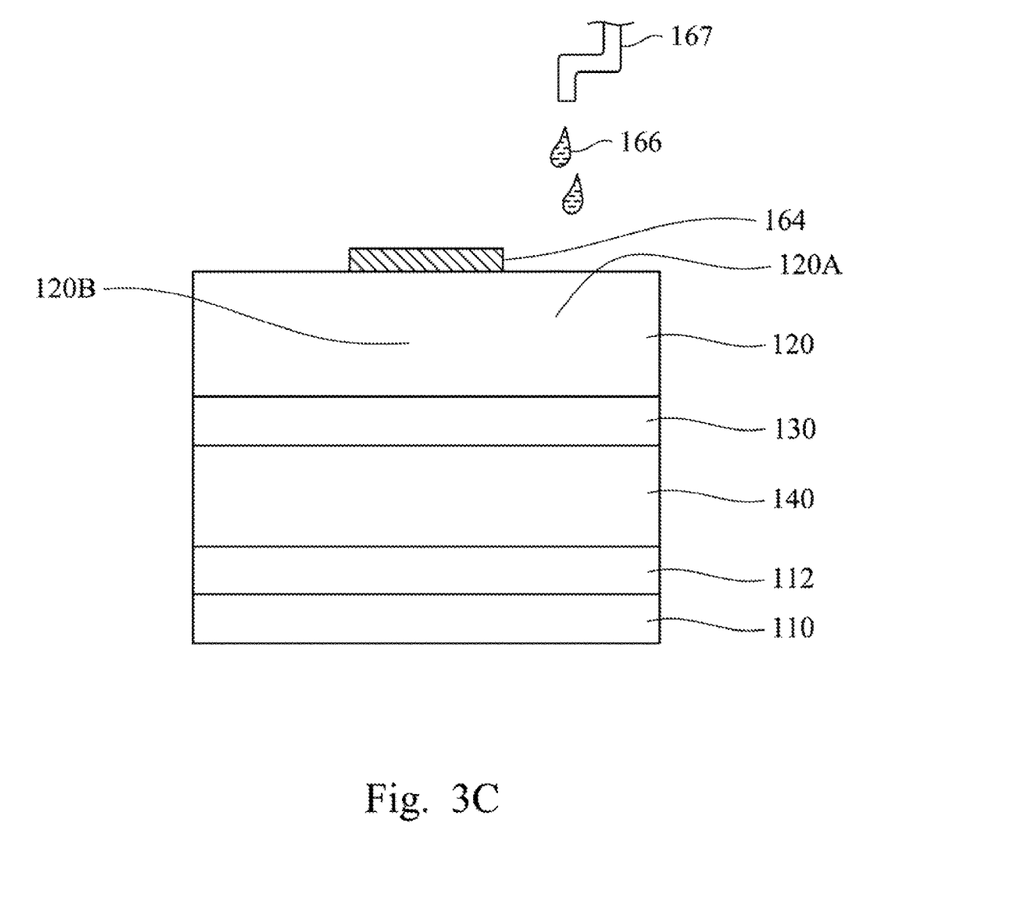
FIG. 3C is a cross-sectional view of an LED at an intermediate stage of a method for manufacturing the same according to some embodiments of the present disclosure.

Furthermore, in some embodiments, the fluid-diffusion process can be performed by other methods, such as applying the fluid agent 166 to the first type semiconductor layer 120 by dropping from a provider. For example, FIG. 3C is a cross-sectional view of an LED at an intermediate stage of a method for manufacturing the same according to some embodiments of the present disclosure, as shown in FIG. 3C, the fluid agent 166 can be applied to the first type semiconductor layer 120 from a provider 167, in which the fluid agent 166 may drop from the provider 167 to the first type semiconductor layer 120. Then, a top surface of the first type semiconductor layer 120 may be coated or covered with the fluid agent 166, thereby performing the diffusing.

Figure 4:
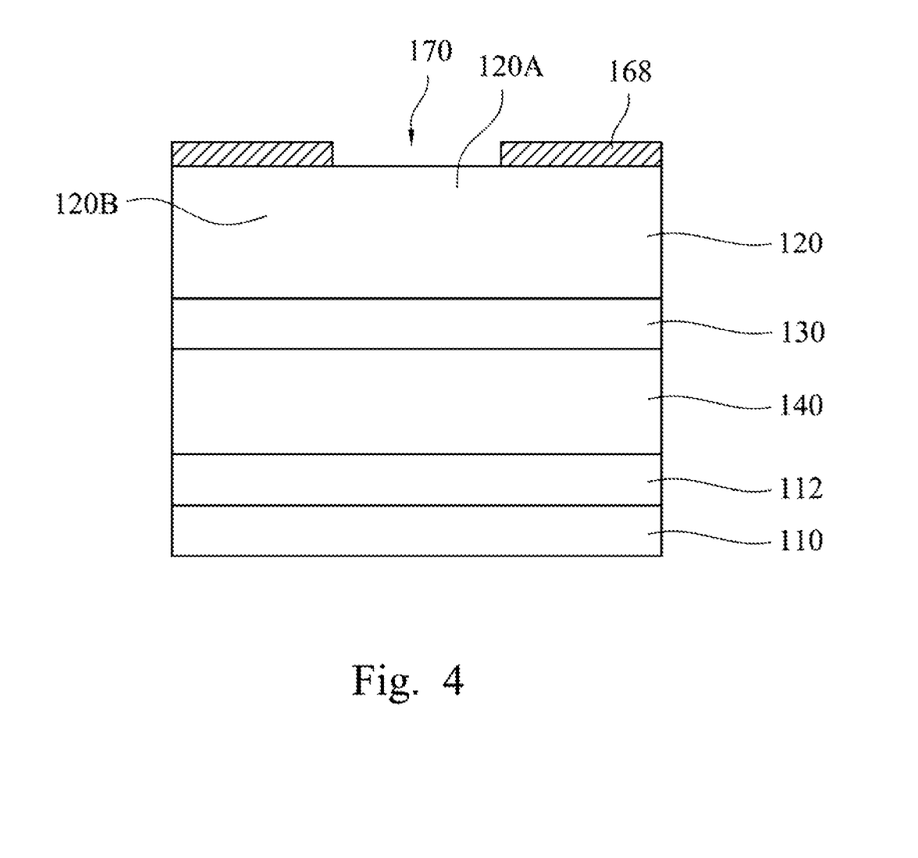
FIG. 4 is cross-sectional view of an LED at an intermediate stage of a method for manufacturing the same according to some embodiments of the present disclosure.

The LED including the first type semiconductor layer with the low and high resistance portions can be manufactured by a method illustrated in FIG. 4 as well, in which FIG. 4 is a cross-sectional view of an LED at an intermediate stage of a method for manufacturing the same according to some embodiments of the present disclosure. The difference between the operations illustrated in FIG. 4 and the operations illustrated in FIGS. 2A-2C is that the performed post diffusion process illustrated in FIG. 4 is a solid-diffusion process. In addition, in the operations illustrated in FIG. 4, details which are similar to the operations illustrated in FIG. 2A are not repeated to avoid duplicity.

As shown in FIG. 4, a cap layer 168 having a hole 170 is formed on a combination of a growth substrate 110, a buffer layer 112, a first type semiconductor layer 120, an active layer 130, and a second type semiconductor layer 140, in which the cap layer 168 is disposed on and joined with the first type semiconductor layer 120 to cover a portion of the first type semiconductor layer 120 and to expose another portion of the first type semiconductor layer 120 through the hole 170. In some embodiments, after the formation of the cap layer 168, the first type semiconductor layer 120 can be divided into an exposed portion 120A and a covered portion 120B. The cap layer 168 includes an impurity, and the impurity includes silicon, oxygen, germanium, titanium, or combinations thereof.

Then, a post diffusion process is performed, in which the performed post diffusion process illustrated in FIG. 4 is a solid state-diffusion process. That is, and the cap layer 168, the post diffusion process can be performed under high temperature to heating a combination of the first type semiconductor layer 120 and the cap layer 168, such as a temperature within a range, from 150° C. to 800° C. During the post diffusion process, the impurity can be diffused into the covered portion 120B of the first type semiconductor layer 120 from the cap layer 168. In some embodiments, in the post diffusion process, the temperature and the period can be referred to as the parameters. In this regard, turning the parameters may control the depth of the impurity diffusing into the covered portion 120B of the first type semiconductor layer 120.

After the post diffusion process, the resistivity of the covered portion 120B of the first type semiconductor layer 120 is greater than the resistivity of the exposed portion 120A of the first type semiconductor layer 120. Therefore, the covered portion 120B of FIG. 4 corresponds to the high resistance portion 124 of FIG. 1A, and the exposed portion 120A of FIG. 4 corresponds to the low resistance portion 122 of FIG. 1A. In addition, a vertical projection of the hole 170 of the cap layer 168 on the first type semiconductor layer 120 may at least partially overlap, with the low resistance portion 122 of the first type semiconductor layer of FIG. 1A, and thus the dimension of the low resistance portion 122 can be defined by the dimension of the hole 170. Furthermore, after the post diffusion process, the cap layer 168 can be removed from the first type semiconductor layer 120, and the first electrode layer 150 (see FIG. 1A) is formed on the first type semiconductor layer 120.

Figure 5A:
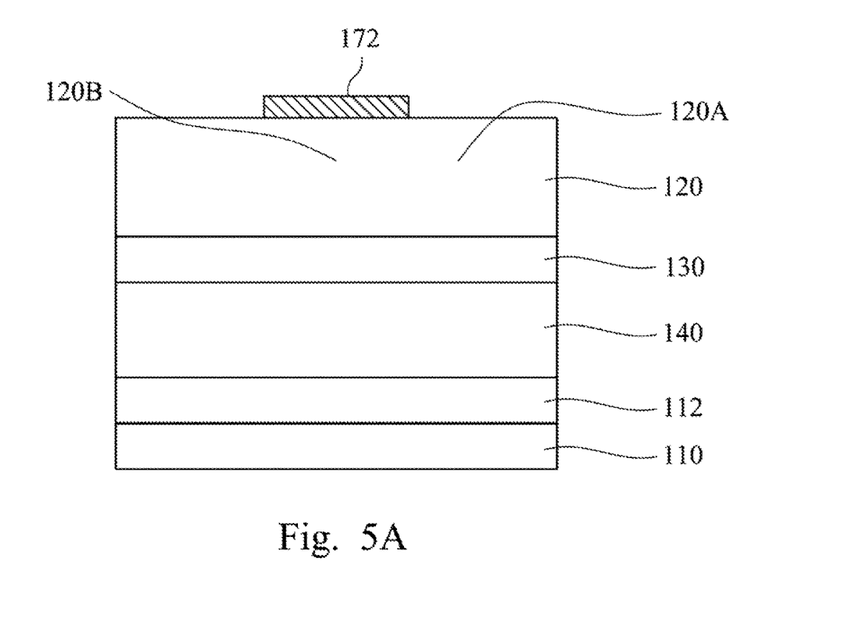
FIGS. 5A-5B are cross-sectional views of an LED at an intermediate stage of a method for manufacturing the same according to some embodiments of the present disclosure.
Figure 5B:
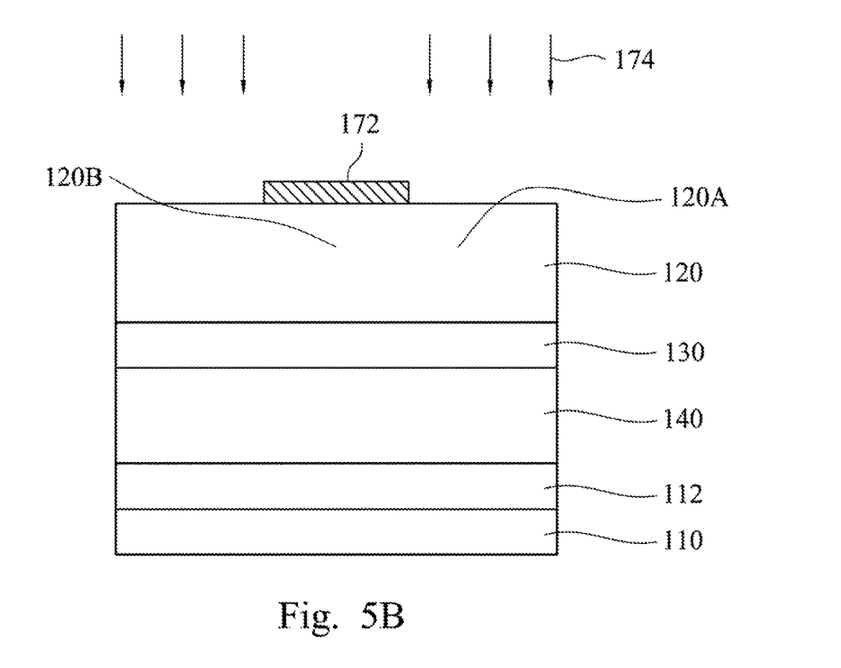

The LED including the first type semiconductor layer with the low and high resistance portions can be manufactured by a method illustrated in FIGS. 5A-5B as well, in which FIGS. 5A-5B are cross-sectional views of an LED at an intermediate stage of a method for manufacturing the same according to some embodiments of the present disclosure. The difference between the operations illustrated in FIGS. 5A-5B and the operations illustrated in FIGS. 2A-2C is that the impurity is implanted into the first type semiconductor layer 120 by an ion implantation process. In addition, in the operations illustrated in FIGS. 5A-5B, details which are similar to the operations illustrated in FIG. 2A are not repeated to avoid duplicity.

As shown in FIG. 5A, a third protection layer 172 is formed on a combination of a growth substrate 110, a buffer layer 112, a first type semiconductor layer 120, an active layer 130 and a second type semiconductor layer 140, in which the second protection layer 172 is disposed on and joined with the first type semiconductor layer 120 to cover a portion of the first type semiconductor layer 120. In some embodiments, after the formation of the second protection layer 172, the first type semiconductor layer 120 can be divided into an exposed portion 120A and a covered portion 120B. In some embodiments, the third protection layer 172 includes silicon dioxide, silicon nitride, polymer resistor material, or combinations thereof.

As shown in FIG. 5B, an ion implantation process is performed, in which an ion beam 174 is applied to the first type semiconductor layer 120. In some embodiments, the ion beam 174 includes silicon ions, oxygen ions, germanium ions, titanium ions, or combinations thereof. During the ion implantation process, the ions can be implanted into the exposed portion 120A of the first type semiconductor layer 120 such that the concentration of the impurity (e.g., silicon, oxygen, germanium, titanium, or combinations thereof) present in the exposed portion 120A is greater than the concentration of the impurity present in the covered portion 120B.

After the ion implantation process, the resistivity of the exposed portion 120A of the first type semiconductor layer 120 is greater than the resistivity of the covered portion 120B of the first type semiconductor layer 120. Therefore, the exposed portion 120A of FIG. 5B corresponds to the high resistance portion 124 of FIG. 1A, and the covered portion 120B of FIG. 5B corresponds to the low resistance portion 122 of FIG. 1A. In some embodiments, after the ion implantation process, an annealing process can be perform on the combination of the first type semiconductor layer 120, the active layer 130 and the second type semiconductor layer 140, thereby curing the generation of lattice defects caused by the ion implantation process. In addition, after the ion implantation process, the third protection layer 172 can be removed, and the first electrode layer 150 (see FIG. 1A) is formed on the first type semiconductor layer 120.

Figure 6:
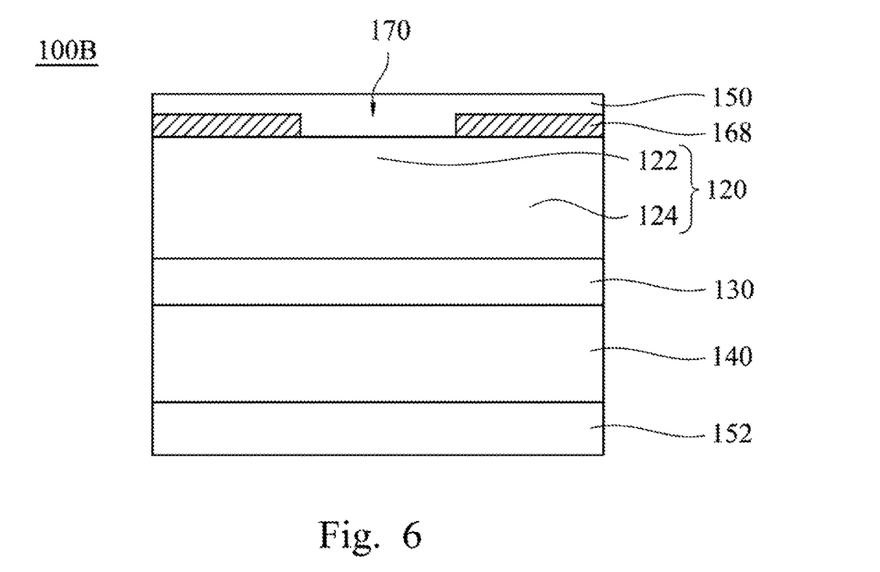
FIG. 6 is a cross-sectional view of an LED according to a second embodiment of the present disclosure.

FIG. 6 is a cross-sectional view of an LED 100B according to a second embodiment of the present disclosure. The difference between the present embodiment and the first embodiment is that the LED 100B further includes a cap layer 168 having a hole 170. The cap layer 168 includes an impurity, in which the impurity includes silicon, oxygen, germanium, titanium, or combinations thereof. The concentration of the impurity present in the high resistance portion 124 is higher than that of the impurity present in the low resistance portion 122. Furthermore, the first electrode layer 150 disposed on the first type semiconductor layer 120 is in contact with the first type semiconductor layer 120 through the hole 170 of the cap layer 168.

To manufacture the LED 100B, after the manufacturing stage illustrated in FIG. 4, the removing of the cap layer 168 can be omitted, such that the cap layer 168 is remained. In some embodiments, as the cap layer 168 is made of silicon, the cap layer 168 can be referred to as a silicon residue. Furthermore, in the manufacture process of the LED 100B, since the removing of the cap layer 168 is omitted, the first electrode layer 150 is formed on and joined with a combination of the first type semiconductor layer 120 and the cap layer 168. In some embodiments, before the formation of the first electrode layer 150, an additional process can be performed to make the cap layer 168 become an electrical conductor. In alternative embodiments, before the formation of the first electrode layer 150, an additional process can be performed to make the cap layer 168 become an insulator, such as a passivation layer. For example, as the cap layer 168 is made of silicon, the additional process can be performed by applying oxygen to the cap layer 168 to make the cap layer 168 transform into a silicon dioxide layer.

Figure 7:
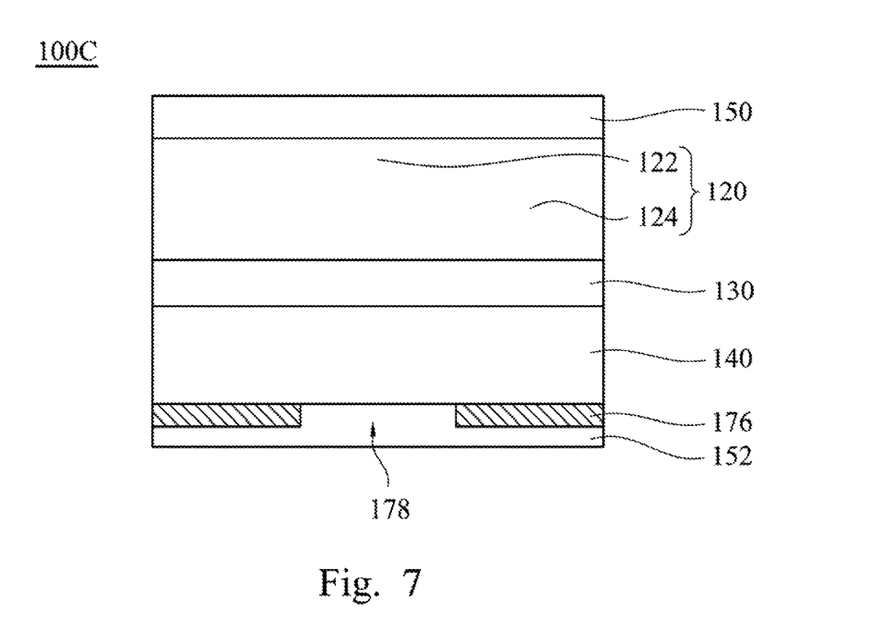
FIG. 7 is a cross-sectional view of an LED according to a third embodiment of the present disclosure.

FIG. 7 is a cross-sectional view of an LED 100C according to a third embodiment of the present disclosure. The difference between the present embodiment and the first embodiment is that the LED 100C further includes a current control layer 176 joined with the second type semiconductor layer 140. The current control layer 176 has an opening 178 therein, and a vertical projection of the opening 178 of the current control layer 176 on the first type semiconductor layer 120 at least partially overlaps with the low resistance portion 122 of the first type semiconductor layer 120. In addition, the second electrode layer 152 is electrically coupled with the second type semiconductor layer 140 through the opening 178.

To manufacture the LED 100C, before the formation of the second electrode layer 152, the current control layer 176 is formed on and joined with the second type semiconductor layer 140. In some embodiments, the current control layer 176 is a dielectric layer which is made of a dielectric material, such as silicon nitride or silicon dioxide. In some embodiments, the current control layer 176 is a semiconductor layer such that the second type semiconductor layer 140 and the current control layer 176 can form a Schottky barrier therebetween. In some embodiments, the current control layer 176 is one of a hole blocking layer and an electron blocking layer.

Furthermore, while the current control layer 176 illustrated FIG. 7 is joined with the second type semiconductor layer 140, the current control layer 176 can be formed at other locations in the LED structure. In some embodiments, the current control layer 176 can be present within one of the first type semiconductor layer 120 and the second type semiconductor layer 140, and the current control layer 176 can be disposed to be in contact with the active layer 130 or be separated from the active layer 130 by a portion of the semiconductor layer. In addition, in some embodiments, more than one current control layer can be disposed in the LED structure, and the disposition of each of the current control layers is independent.

Figure 8:
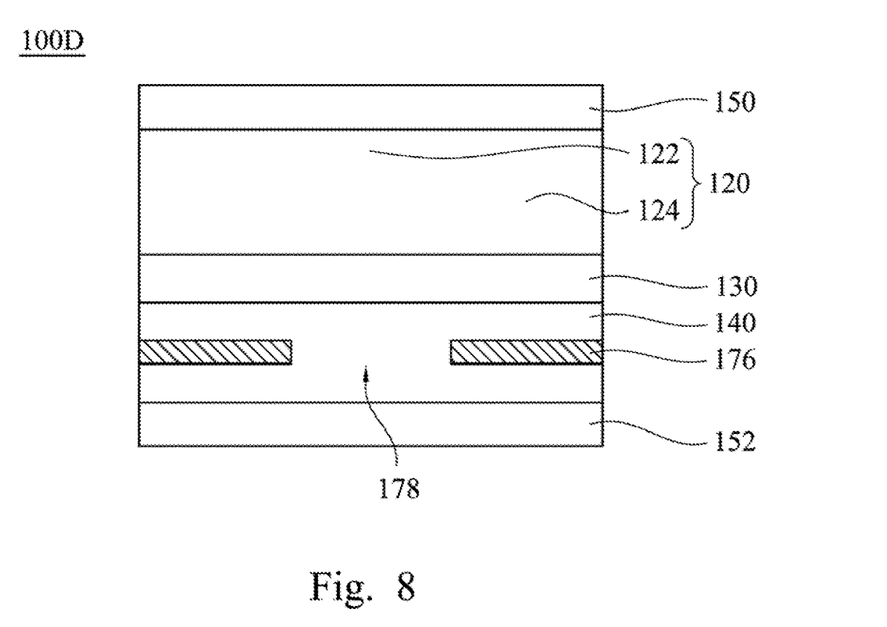
FIG. 8 is a cross-sectional view of an LED according to a fourth embodiment of the present disclosure.
Figure 9:
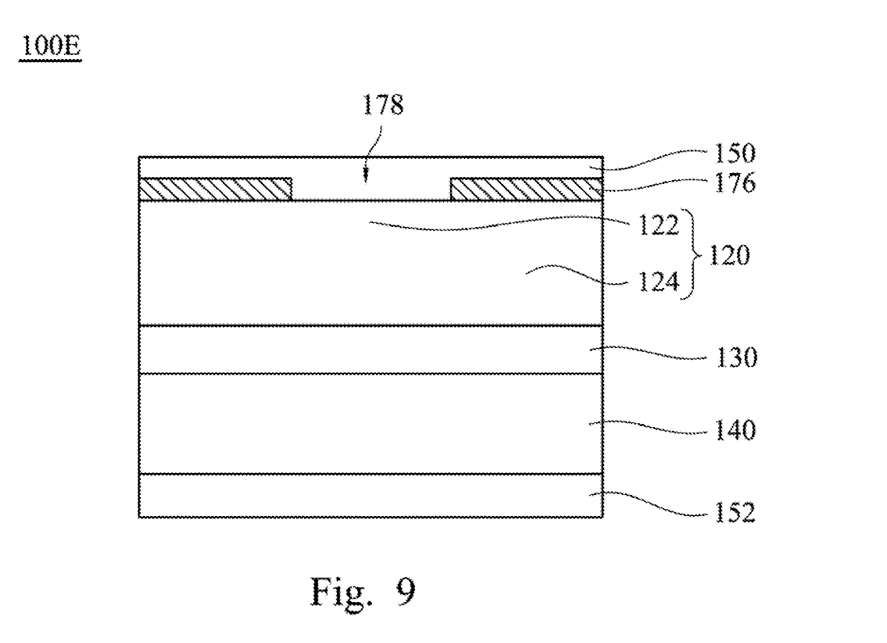
FIG. 9 is a cross-sectional view of an LED according to a fifth embodiment of the present disclosure.

For example, FIG. 8 is a cross-sectional view of an LED 100D according to a fourth embodiment of the present disclosure, as shown in FIG. 8, the current control layer 176 having the opening 178 is present within the second type semiconductor layer 140, in which the current control layer 176 is separated from the active layer 130 by a portion of the second type semiconductor layer 140. In some embodiments, the current control layer 176 can be disposed to be present within the first type semiconductor layer 120 as well. FIG. 9 is a cross-sectional view of an LED 100E according to a fifth embodiment of the present disclosure, as shown in FIG. 9, the current control layer 176 having the opening 178 is joined with the first type semiconductor layer 120, in which the current control layer 176 is disposed between the first type semiconductor layer 120 and the first electrode 150, and the first electrode 150 is electrically coupled with the first type semiconductor layer 120 through the opening 178.

Figure 10:
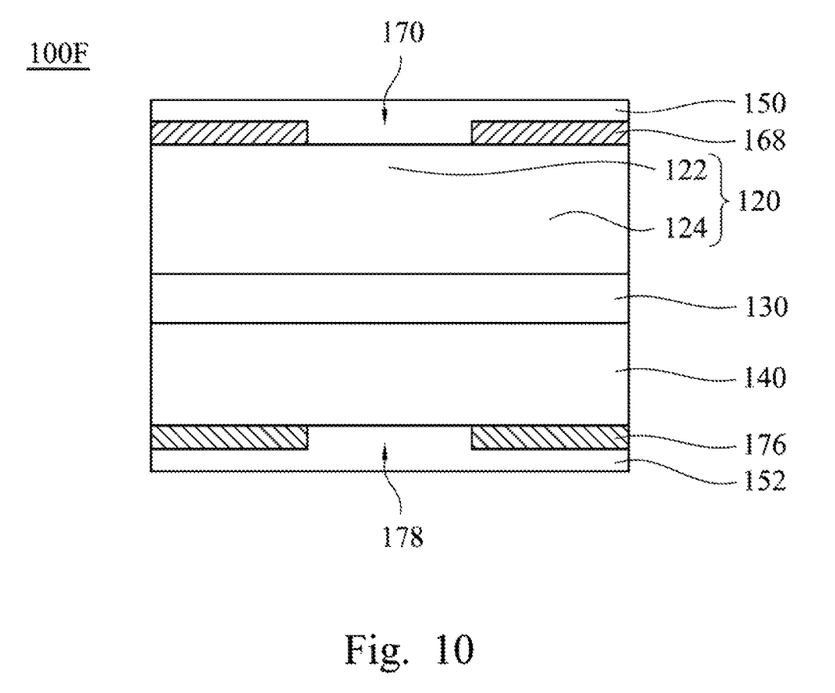
FIG. 10 is a cross-sectional view of an LED according to a sixth embodiment of the present disclosure.

FIG. 10 is a cross-sectional view of an LED 100F according to a sixth embodiment of the present disclosure. The difference between the present embodiment and the second and third embodiments is that the LED 100F can be referred to as a combination of the LEDs 100B and 100C. That is, the cap layer 168 having the hole 170 is remained to join with the first type semiconductor layer 120, and the current control layer 176 having the opening 178 is joined with the second type semiconductor layer 140. In some embodiments, vertical projections of the hole 170 and the opening 178 on the first type semiconductor layer 120 at least partially overlap with the low resistance portion 122 of the first type semiconductor layer 120. Similarly, although the current control layer 176 illustrated FIG. 10 is joined with the second type semiconductor layer 140, the current control layer 176 can be formed at other locations in the LED structure as well.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A method for manufacturing a light-emitting diode (LED), the method comprising:
    forming a first type semiconductor layer;
    forming a second type semiconductor layer on the first type semiconductor layer; and
    implanting an impurity into a first portion of the second type semiconductor layer and spacing the implanted impurity apart from the first type semiconductor layer, wherein the concentration of the impurity present in the first portion of the second type semiconductor layer is greater than the concentration of the impurity present in a second portion of the second type semiconductor layer after the implanting, such that the resistivity of the first portion of the second type semiconductor layer is greater than the resistivity of the second portion of the second type semiconductor layer.

2. The method of claim 1, wherein the impurity comprises silicon, oxygen, germanium, titanium, or combinations thereof.

3. The method of claim 2, wherein the implanting comprises an ion implantation process, wherein the ion implantation process comprises:
    forming a protection layer to cover the second portion of the second type semiconductor layer; and
    applying an ion beam to the second type semiconductor layer, wherein the ion beam comprises silicon ions, oxygen ions, and germanium ions, titanium ions, or combinations thereof.

4. The method of claim 2, wherein the implanting comprises post diffusing the impurity into the first portion of the second type semiconductor layer.

5. The method of claim 4, wherein the post diffusing comprises:
    forming a protection layer on the second portion of the second type semiconductor layer; and
    applying a gaseous agent to the second type semiconductor layer to perform the post diffusing, wherein the gaseous agent comprises the impurity.

6. The method of claim 4, wherein the post diffusing comprises:
    forming a protection layer on the second portion of the second type semiconductor layer; and
    applying a fluid agent to the second type semiconductor layer to perform the post diffusing, wherein the fluid agent comprises the impurity.

7. The method of claim 4, wherein the post diffusing comprises:
    forming a cap layer on the first portion of the second type semiconductor layer, wherein the cap layer comprises the impurity; and
    diffusing the impurity from the cap layer into the first portion of the second type semiconductor layer.

8. The method of claim 7, wherein the forming the cap layer on the first portion of the second type semiconductor layer comprises:
    forming the cap layer with a hole, wherein a vertical projection of the hole of the cap layer on the second type semiconductor layer at least partially overlaps with the second portion of the second type semiconductor layer.

9. The method of claim 7, wherein the post diffusing is performed by heating a combination of the second type semiconductor layer and the cap layer.

10. The method of claim 7, further comprising:
    removing the cap layer from the second type semiconductor layer.

11. The method of claim 7, further comprising:
    forming an electrode layer on a combination of the second type semiconductor layer and the cap layer.

12. The method of claim 2, further comprising:
    forming a current control layer joined with the first type semiconductor layer, the second type semiconductor layer, or combinations thereof, wherein the current control layer has an opening, and a vertical projection of the opening on the second type semiconductor layer at least partially overlaps with the second portion.

13. The method of claim 2, wherein the first type semiconductor layer is an N-type semiconductor layer, the second type semiconductor layer is a P-type semiconductor layer, and the method further comprises:
    forming an active layer between the first type semiconductor layer and the second type semiconductor layer.

* * * * *